United States Patent [19]
Hunter et al.

[11] Patent Number: 5,921,422
[45] Date of Patent: Jul. 13, 1999

[54] ENCLOSURE WITH SPRING CLAMPS AND STANDS COVERING THE CLAMPS

[75] Inventors: Charles L Hunter; Luke Waaler, both of Loveland, Colo.

[73] Assignee: Hewlett-Packard Company, Palo Alto, Calif.

[21] Appl. No.: 08/935,952

[22] Filed: Sep. 23, 1997

[51] Int. Cl.⁶ .................................................. B65D 45/00
[52] U.S. Cl. ..................... 220/4.02; 220/4.21; 220/326
[58] Field of Search ................................ 220/4.02, 4.21, 220/4.24, 281, 324, 326

[56] References Cited

U.S. PATENT DOCUMENTS

| | | | |
|---|---|---|---|
| 3,317,073 | 5/1967 | Woerner | 220/326 X |
| 3,868,041 | 2/1975 | Knize | 220/324 |
| 4,330,050 | 5/1982 | Sangster et al. | 220/324 X |
| 4,556,150 | 12/1985 | Ikumi | 220/326 X |
| 5,013,105 | 5/1991 | Rossum, Jr. | 312/263 |
| 5,032,791 | 7/1991 | Serio, Jr. | 220/281 |

*Primary Examiner*—Steven Pollard
*Attorney, Agent, or Firm*—Augustus W. Winfield

[57] ABSTRACT

An enclosure having two pieces that are held together with spring clips and having a stand that covers each spring clip. The spring clips provide a high retention force for vibration and shock. The stands cover the spring clips and provide anti-slip feet. In an example embodiment, the enclosure has a hinge surface formed from mating edges of the two pieces on one side with the spring clips holding the two pieces together on an opposite side. For automated assembly, the two pieces are joined at the hinge surfaces and then snapped into the spring clips and stands.

2 Claims, 9 Drawing Sheets

ENCLOSURE WITH SPRING CLAMPS AND STANDS COVERING THE CLAMPS

FIELD OF INVENTION

This invention relates generally to enclosures used to house electronic instruments and the like and more specifically to an enclosure with two pieces clamped together.

BACKGROUND OF THE INVENTION

Electronic instruments, computer peripheral devices, and similar products are often housed in an enclosure comprising two pieces, for example a top and a bottom, that are joined. Screws are commonly used to join the two enclosure pieces. For plastic molded enclosures, screws typically require metal inserts which in turn require an additional manufacturing step. In addition, in a high volume automated production environment, screws are relatively time consuming and require relatively expensive equipment.

Plastic molded parts may also be designed to be snapped together. Features may be molded into one part that snap into corresponding features molded into another part. Snap fit parts are typically easy to assemble. However, the features may require substantially increased complexity in the plastic molds, requiring tighter tolerances and additional time to tune the molds to ensure that the parts are held precisely and securely. In addition, snap together parts may be difficult to disassemble for troubleshooting or changes after assembly, possibly requiring a tool or fixture to disengage multiple snap features. Finally, it is relatively difficult to design snap together parts with a high retention force. It is particularly difficult to design snap together parts that can survive the shake, vibration and drop requirements of many commercial consumer products.

There are many ways of holding two parts together. Many of these ways function satisfactorily, but are not aesthetically acceptable for some consumer products. For example, various clamping devices are used for enclosures in harsh environments, such as automobile engine compartments, that function very well but may not be generally acceptable for use on a consumer product where appearance is important.

There is an ongoing need for enclosures having ease of automated assembly, ease of disassembly, low tooling cost, low part cost, pleasing aesthetics, and a capability to withstand rigorous vibration and mechanical shock.

SUMMARY OF THE INVENTION

A two piece enclosure uses molded features for hinge action retention on one side and spring clips on an opposite side. The enclosure includes snap-on stands that serve as anti-slip feet to permit the enclosure to stand in a vertical orientation. The stands cover the spring clips. The spring clips provide a retention force that is substantially higher than the retention force provided by snap together parts. The parts are low cost and easy to remove. Most important, the combination of spring clips and snap-on stands facilitate automatic manufacturing, enabling the enclosure to simply be pressed against the clips and stands.

DETAILED DESCRIPTION OF THE PREFERRED EMBODIMENT OF THE INVENTION

Figure 1:
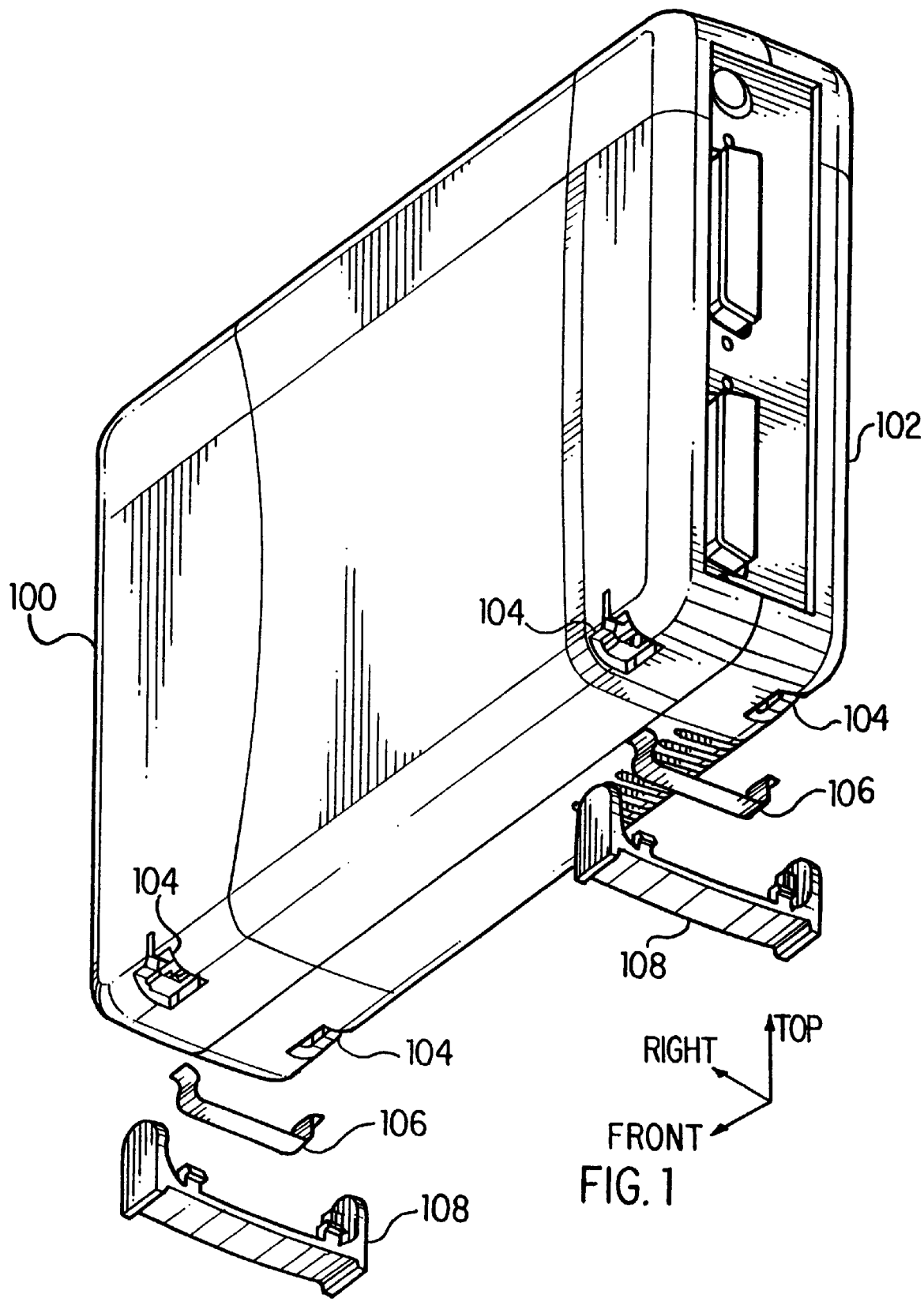
FIG. 1 is a perspective view of the bottom, right, and rear surfaces of an enclosure with a spring clip and stand in accordance with an example embodiment of the invention.

FIG. 1 illustrates an example embodiment of the invention. An enclosure has two major pieces, 100 and 102. Each enclosure piece has an opening 104 at two corners. Two metal spring clips 106 snap into the openings 104 to provide a high retention force for holding the pieces together. Two flexible stands 108 also snap into the openings 104, providing a cosmetic cover for the spring clips 106 as well as providing anti-slip feet to support the completed enclosure in a vertical orientation as illustrated in FIG. 1. In an automated assembly line, one spring clip 106 is placed into each stand 108 and the two enclosure pieces (100 and 102) are simply pressed onto the spring clips and stands so that both spring clips and both stands snap into the openings 104 in the enclosure pieces.

In a specific example embodiment, the spring clips 106 are fabricated from half-hard stainless steel. In the specific example embodiment, each stand 108 is injection molded using a thermoplastic elastomer (Sanoprene) from Advanced Elastomer Systems.

FIG. 1 illustrates the bottom, rear, and right side of the enclosure. Right and left are defined as viewed from the front side, which faces away in FIG. 1. The bottom is the side receiving the spring clips. Therefore, side 100 is the right side and side 102 is the left side.

Figure 2:
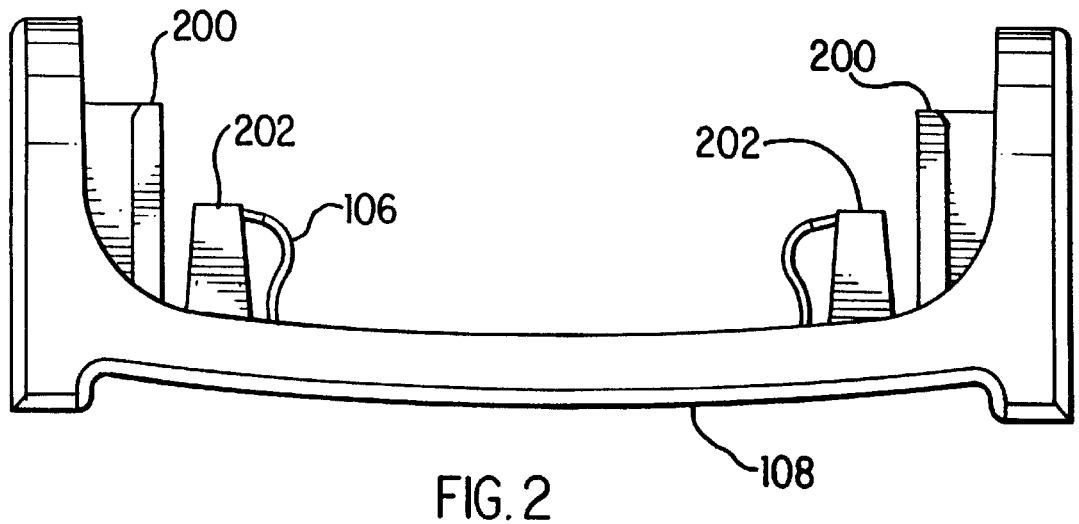
FIG. 2 is a plane front (or rear) view of a stand with a spring clip inserted.
Figure 4:
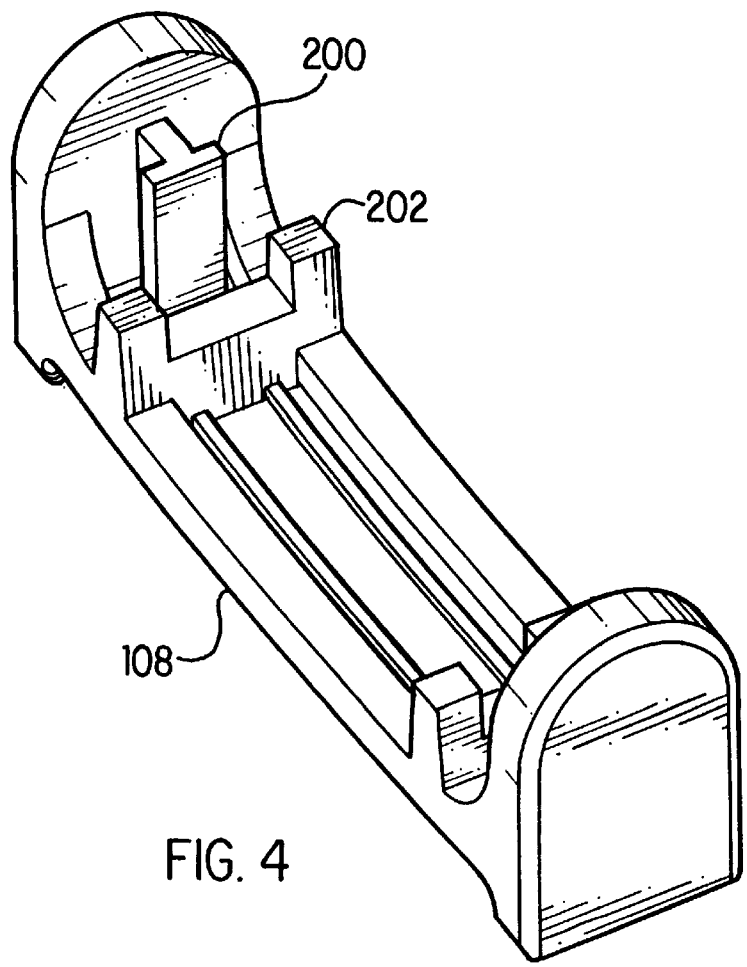
FIG. 4 is a perspective view of a stand.
Figure 3:
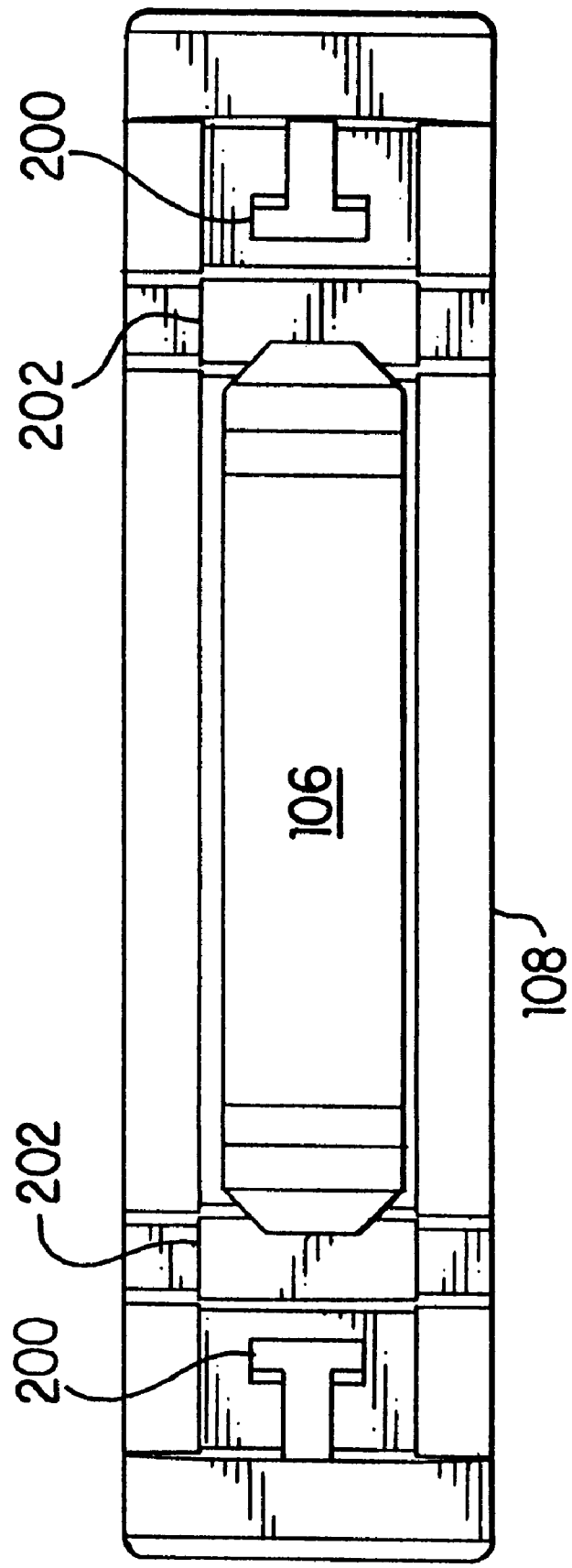
FIG. 3 is a top view of a stand with a spring clip inserted.

FIG. 2 illustrates a view of one stand 108 along its longest dimension, with a spring clip 106 inserted into the stand. FIG. 3 illustrates a top view of a stand 108, with a spring clip 106 inserted into the stand. FIG. 4 illustrates a perspective view of a stand 108 without a spring clip. Each stand 108 has two retainer sections 200 and 202 on each end that provide retention of the stand to the enclosure.

Figure 5:
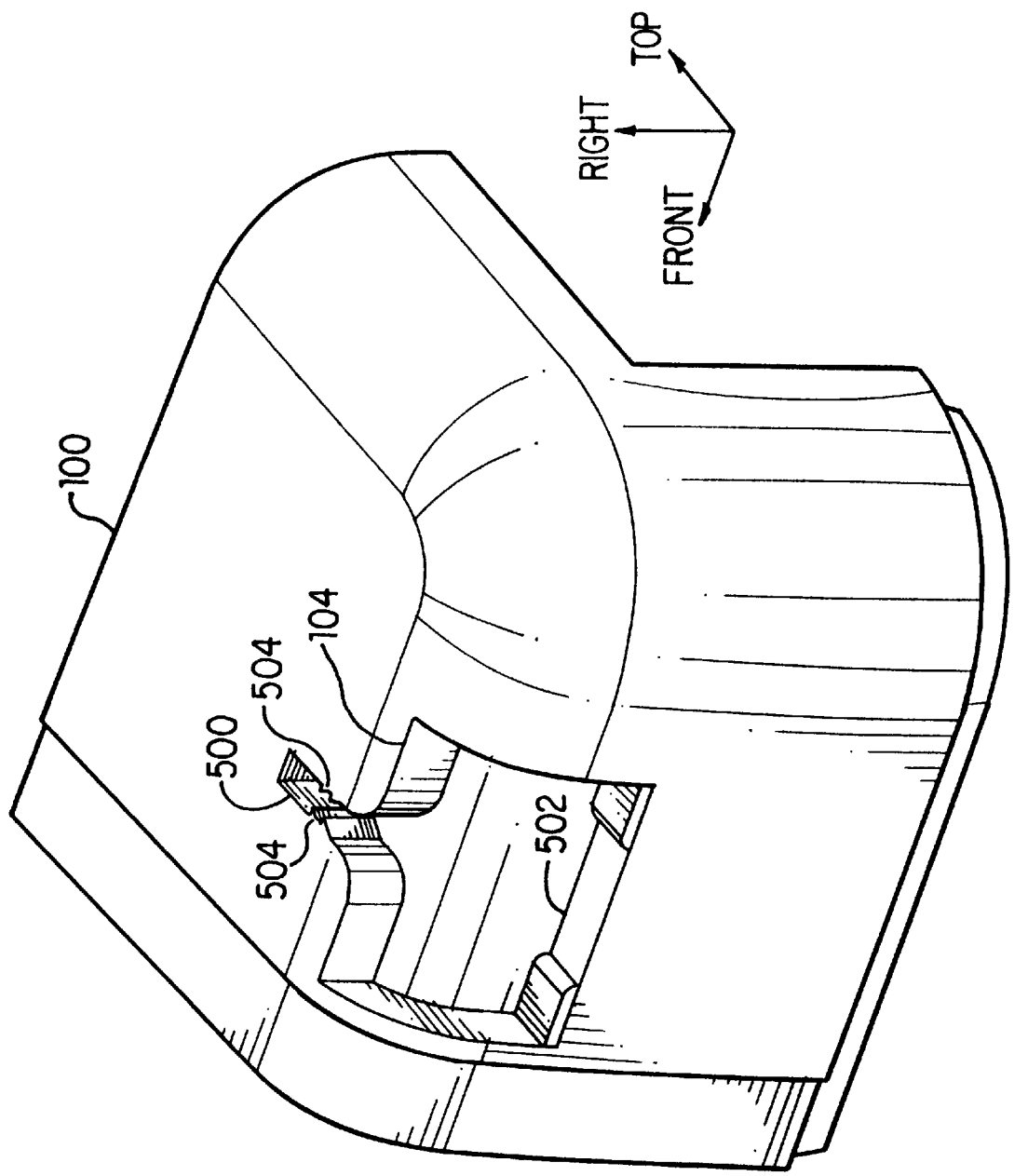
FIG. 5 is a perspective view of the bottom rear corner of the right enclosure piece showing an opening for receiving the spring clip and stand.
Figure 6:
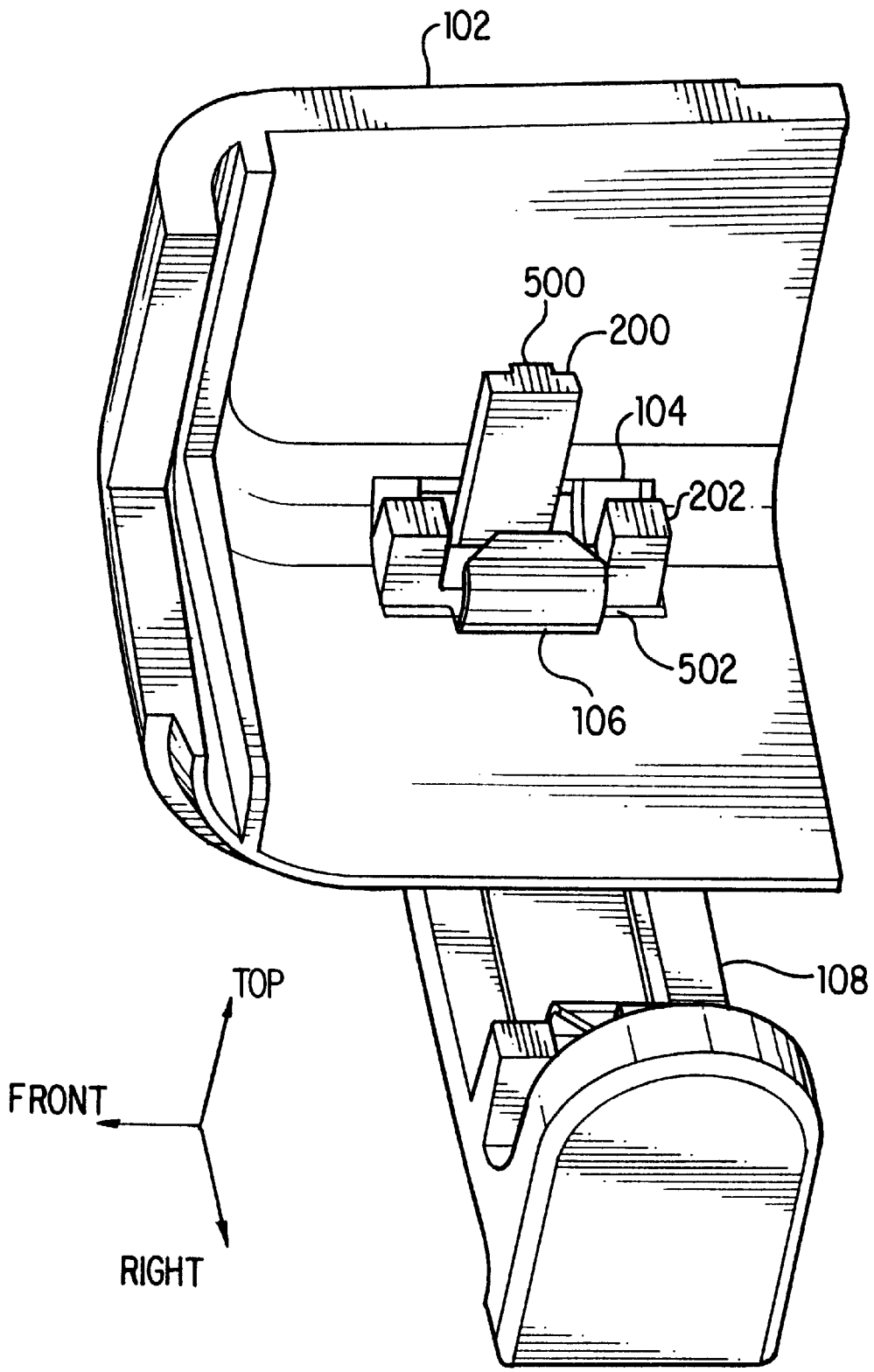
FIG. 6 is a perspective view of the inside surface of the bottom front corner of the left enclosure piece illustrating a spring clip and a stand snapped into a corresponding opening.

FIG. 5 is an expanded external view of an opening 104 for receiving a stand and spring clip. A slit 500 in a right or left side (right in FIG. 5), with gripping surfaces 504, receives the retainer section 200 (FIGS. 24) of a stand. A larger portion 502 of the opening 104 receives retainer section 202 (FIGS. 2–4) of a stand. FIG. 6 is an internal view of an opening with a stand and spring clip inserted. In particular, note that retainer section 200 inserts into slot 500 of the opening 104 and retainer section 202 and the spring clip 106 both insert into portion 502 of the opening 104.

Figure 7:
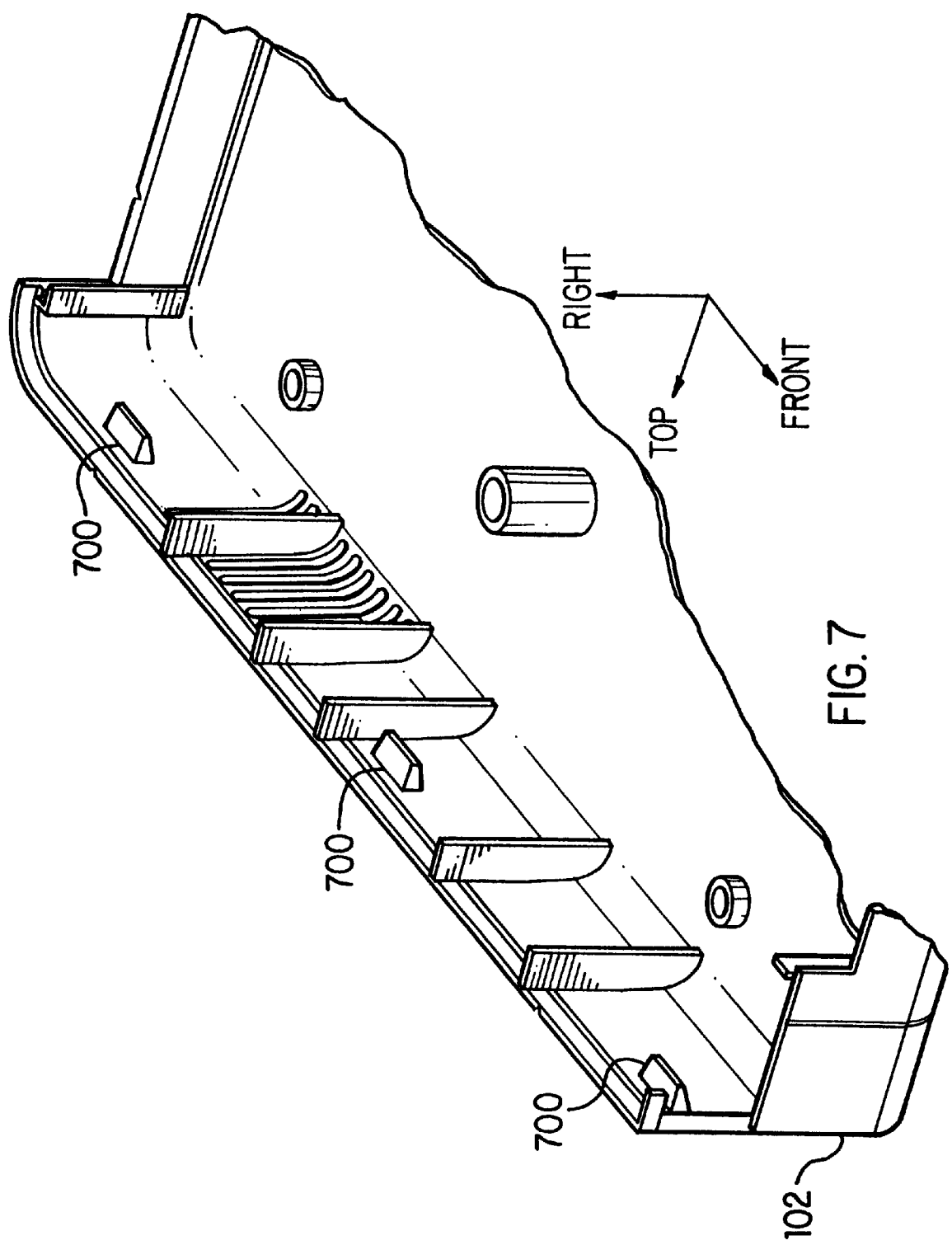
FIG. 7 is a perspective front and bottom view of the left part of the enclosure illustrating hinge details in the inside top surface.

FIG. 7 is a view of the inside of the left side 102 of the enclosure, illustrating three wedge shaped hinge sections

700 along the inside surface of the top side. In the specific example embodiment, each hinge section 700 is about 6.4 mm long. The number and length of each hinge section may vary to accommodate various strengthening ribs, vent holes, or industrial design details.

Figure 8:
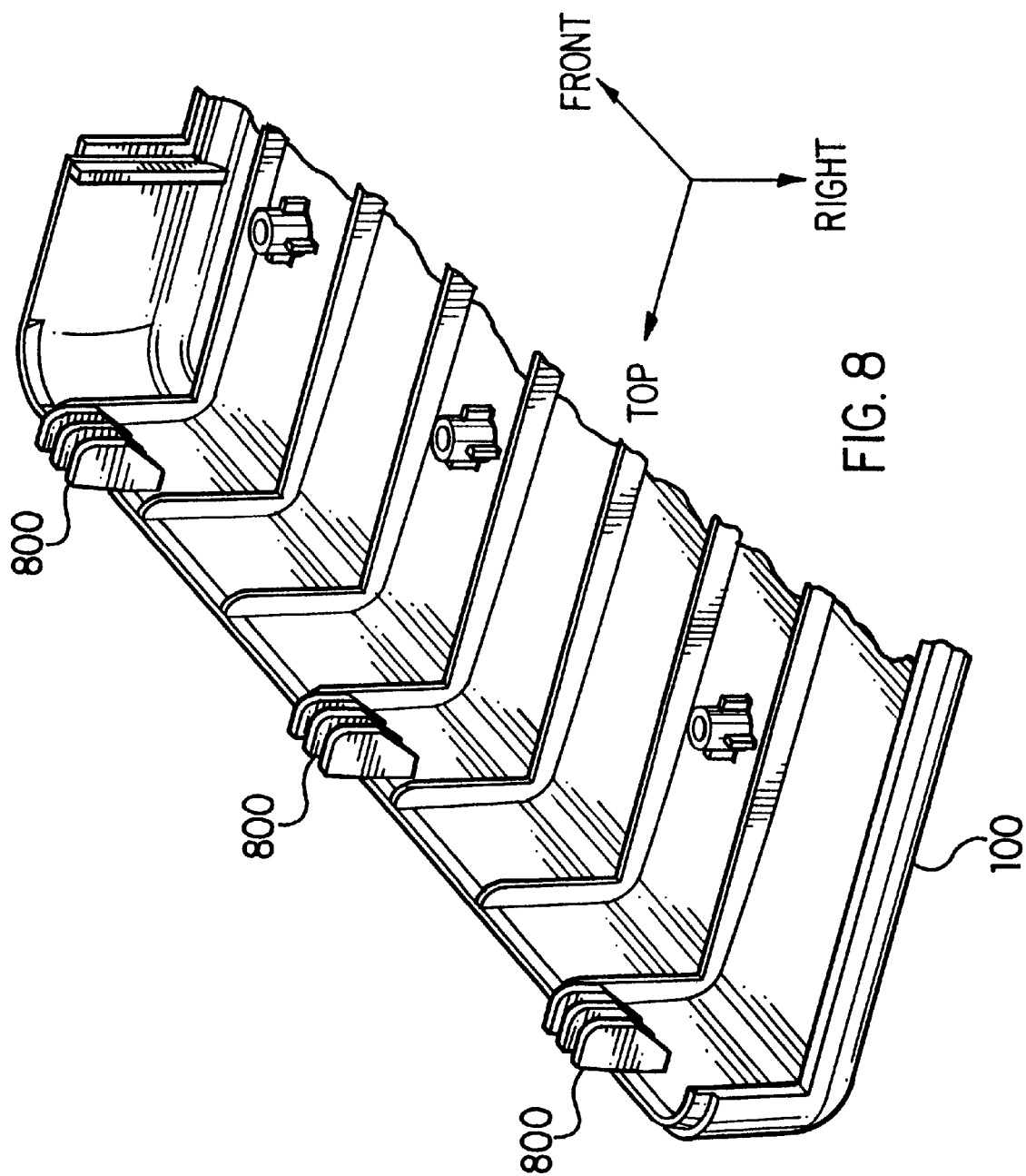
FIG. 8 is a perspective rear and bottom view of the right part of the enclosure illustrating hinge details in the inside top surface.

FIG. 8 is a view of the inside of the right side 100 of the enclosure, illustrating three hinge sections 800 along the inside surface of the top side. Each hinge section 800 has a wedge shaped pocket (not visible in FIG. 8) for receiving a hinge section 700 (FIG. 7) from the left side of the enclosure.

Figure 9:
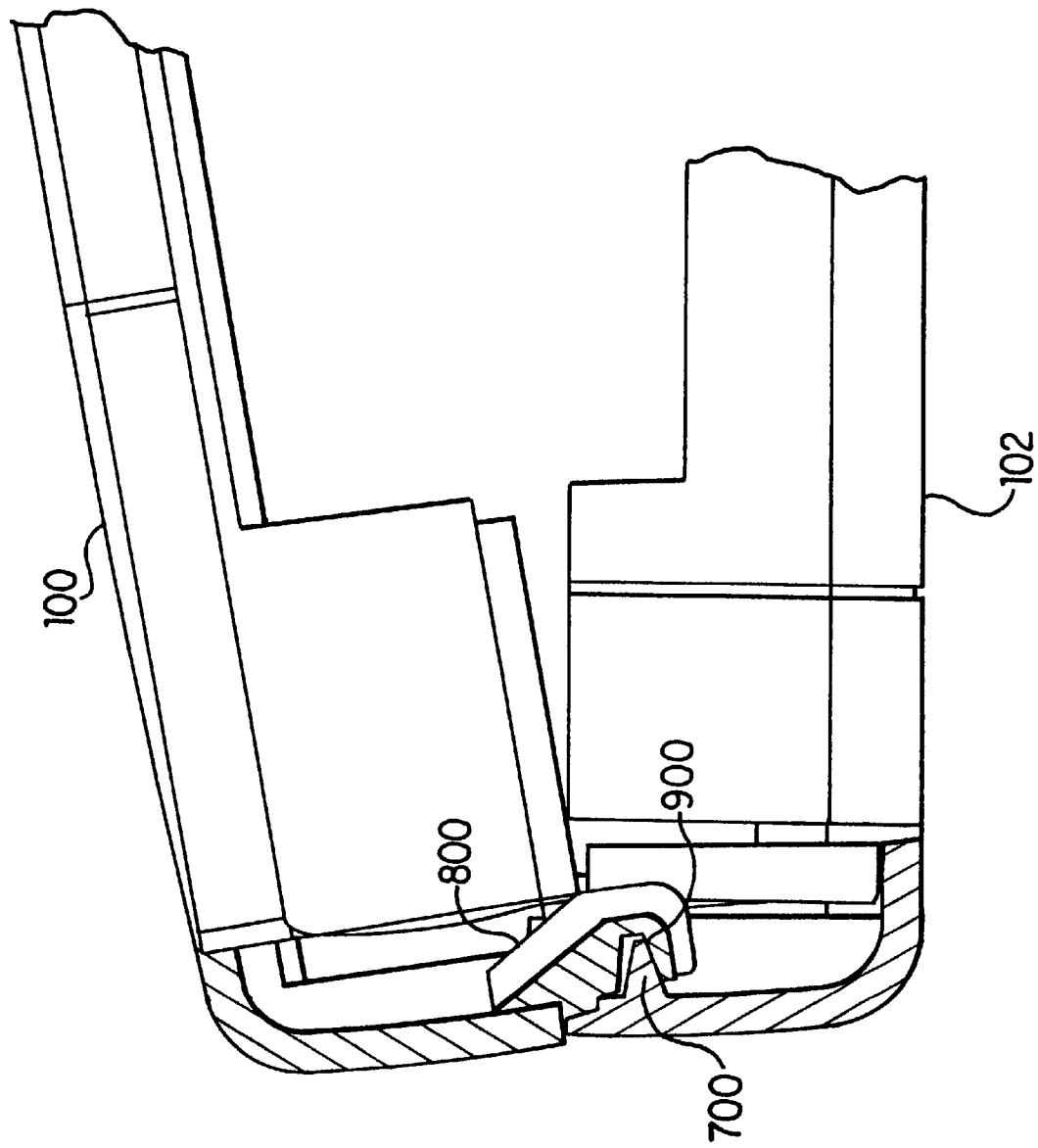
FIG. 9 is a cross section view illustrating how the 2 enclosure parts are hinged together.

FIG. 9 is front view of the right side 100 of the enclosure and the left side 102 of the enclosure with part of the top side cut away to illustrate a cross section through the hinges. Wedge shaped hinge section 700 on the left side 102 inserts into wedge shaped pocket 900 on the right side 100. During assembly, the matching edges on the top side are brought together as illustrated in FIG. 9 to mate the hinge sections and then the matching edges of the bottom side are brought together.

Figure 10:
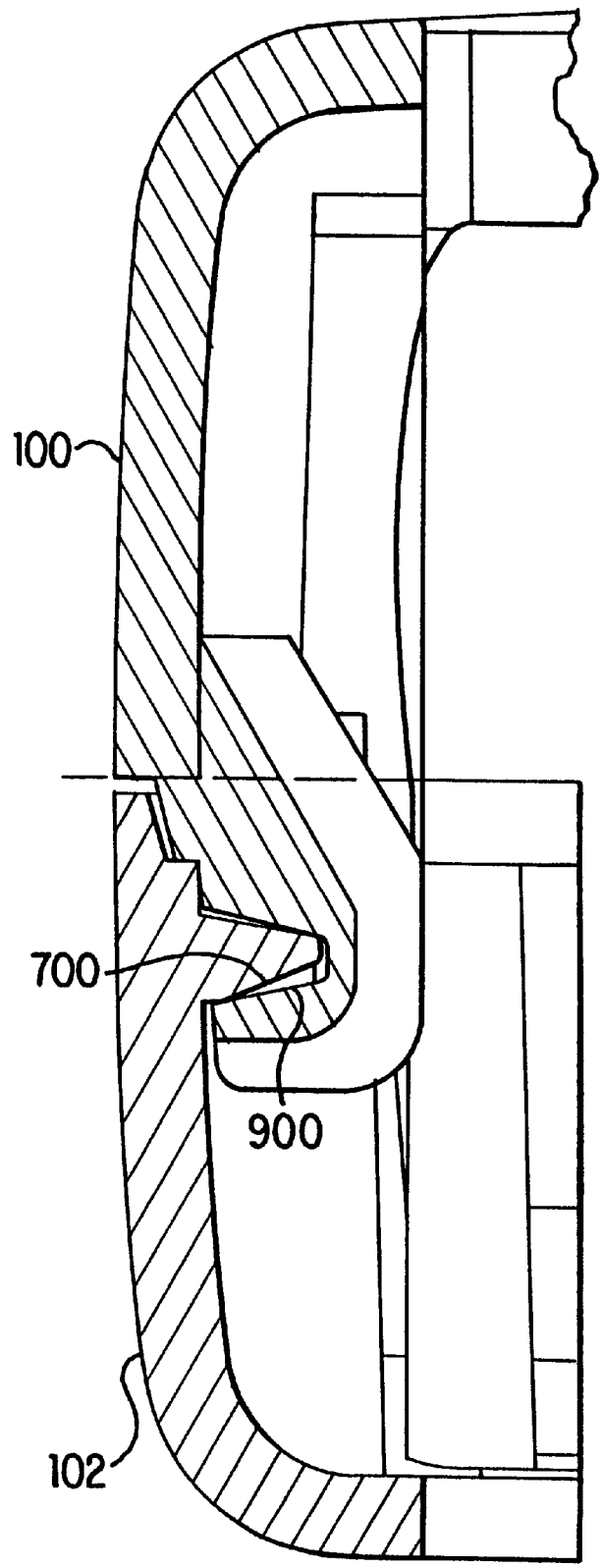
FIG. 10 is an expanded cross section view of the hinges as in FIG. 9 with the 2 enclosure parts fitted together.

FIG. 10 is an expanded view of the hinge parts further illustrating the wedge shaped hinge section 700 on the left side 102 and the wedge shaped pocket 900 on the right side 100.

While the enclosure pieces are pressed together, the enclosure pieces are pressed against spring clips and stands and discussed above to complete the assembly. The combination of hinge and spring clips provides ease of automated assembly, ease of disassembly, low tooling cost, low part cost, pleasing aesthetics, and a capability to withstand rigorous vibration and mechanical shock.

The example embodiment has been illustrated with two clips and two stands. A single clip and stand may be appropriate for some enclosure designs or more than two clips and stands may be appropriate. The example embodiment has been illustrated with a combination of hinge action and spring clips. In some enclosure designs, it may be appropriate to use only spring clips. The example embodiment has been illustrated with two stands for vertical operation. Additional feet may be added for optional horizontal or vertical operation.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An enclosure comprising:

a first piece, the first piece having at least one opening;

a second piece, the second piece having at least one opening;

a spring clip having first and second bent portions so that a spring force resists movement of the bent portions away from each other, the first bent portion being snapped into the opening of the first piece and the second bent portion being snapped into the opening of the second piece; and a stand, the stand having first and second ends, the first end snapped into the opening of the first piece and the second end snapped into the opening of the second piece, the stand covering the spring clip.

2. The enclosure of claim 1 further comprising:

a first surface on the first piece, the opening for the first piece in the first surface;

a second surface on the first piece that is parallel to the first surface;

a pocket on the second surface;

a third surface on the second piece, the opening for the second piece in the third surface;

a fourth surface on the second piece that is parallel to the third surface;

a projection on the fourth surface, positioned so that when the first piece is joined to the second piece the projection is inserted into the pocket, forming a hinge that holds the second and fourth surfaces together and permits the second surface to rotate relative to the fourth surface around the hinge.

* * * * *